(12) United States Patent
Li et al.

(10) Patent No.: US 11,662,370 B2
(45) Date of Patent: May 30, 2023

(54) FREQUENCY SPECTRUM DETECTION SYSTEM

(71) Applicant: INSTITUTE OF SEMICONDUCTORS, CHINESE ACADEMY OF SCIENCES, Beijing (CN)

(72) Inventors: Ming Li, Beijing (CN); Tengfei Hao, Beijing (CN); Jian Tang, Beijing (CN); Nuannuan Shi, Beijing (CN); Wei Li, Beijing (CN); Ninghua Zhu, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 397 days.

(21) Appl. No.: 16/886,443

(22) Filed: May 28, 2020

(65) Prior Publication Data

US 2021/0063452 A1 Mar. 4, 2021

(30) Foreign Application Priority Data

Aug. 30, 2019 (CN) .......................... 201910820924.9

(51) Int. Cl.
*G01R 23/165* (2006.01)
*G01R 23/17* (2006.01)

(52) U.S. Cl.
CPC ........... *G01R 23/165* (2013.01); *G01R 23/17* (2013.01)

(58) Field of Classification Search
CPC .............................. G01R 23/17; G01R 23/165
See application file for complete search history.

(56) References Cited

U.S. PATENT DOCUMENTS 4,644,267 A * 2/1987 Tsui ..................... H01Q 3/2676
359/310
9,923,631 B1 * 3/2018 Moilanen ............... H04B 17/00
(Continued)

FOREIGN PATENT DOCUMENTS

CN  105576478 A  5/2016
CN  109818235 A  5/2019
(Continued)

OTHER PUBLICATIONS

Hao, T., Tang, J., Li, W., Zhu, N. and Li, M., 2018. Microwave photonics frequency-to-time mapping based on a Fourier domain mode locked optoelectronic oscillator. Optics Express, 26(26), pp. 33582-33591.
(Continued)

*Primary Examiner* — Jeff W Natalini
(74) *Attorney, Agent, or Firm* — Christopher R. Christenson; Kelly, Holt & Christenson, PLLC

(57) ABSTRACT

A frequency spectrum detection system including: a frequency-scan light source, a phase modulator, an optical filter, an optical fiber, a photodetector, a power divider, an electric amplifier, a combiner, an electric filter, and an oscilloscope. The frequency-scan light source, the phase modulator, the optical filter, the photodetector, and the electric amplifier form a ring-shaped optoelectronic oscillator resonant cavity, which is configured to generate a frequency-scan signal. The combiner is configured to receive a signal to be measured. The phase modulator is configured to modulate the combined electrical signal onto a frequency-scan optical signal. The optical filter is configured to selectively attenuate or amplify one sideband of double sidebands of the double-sideband phase-modulated optical signal. The photodetector is configured to detect a signal filtered by the optical filter.

8 Claims, 3 Drawing Sheets

(56) References Cited

U.S. PATENT DOCUMENTS

| | | | |
|---|---|---|---|
| 2019/0011558 A1* | 1/2019 | Crouch | G01S 7/4866 |
| 2020/0124650 A1* | 4/2020 | Zheng | H01S 3/08086 |

FOREIGN PATENT DOCUMENTS

| | | |
|---|---|---|
| CN | 109842444 A | 6/2019 |
| CN | 110137778 A | 8/2019 |
| CN | 110702985 A | 1/2020 |
| CN | 110702988 A | 1/2020 |

OTHER PUBLICATIONS

Hao, T., Tang, J., Shi, N., Li, W., Zhu, N. and Li, M., 2019. Multiple-frequency measurement based on a Fourier domain mode-locked optoelectronic oscillator operating around oscillation threshold. Optics letters, 44(12), pp. 3062-3065.

Shao, Y., Han, X., Li, M., Liu, Q. and Zhao, M., 2019. Microwave Downconversion- by a Tunable Optoelectronic Oscillator Based on PS-FBG and Polarization-Multiplexed Dual loop. IEEE Transactions on Microwave Theory and Techniques. 67(5), pp. 2095-2102.

Hao, T., Cen, Q., Dai. Y., Tang, J., Li, W., Yao, J., Zhu, N. and Li. M., 2018, Breaking the limitation of mode building time in an optoelectronic oscillator. Nature communications, 9(1), pp. 1-8.

First Chinese Office Action, dated May 29, 2020 for Chinese patent application No. 201910820924.9, 15 pages including English translation.

Second Chinese Office Action dated Dec. 18, 2020 for Chinese patent application No. 201910820924.9, 13 pages including English translation.

\* cited by examiner

FREQUENCY SPECTRUM DETECTION SYSTEM

CROSS-REFERENCE TO RELATED APPLICATION

This application claims the benefit of Chinese Patent Application No. 201910820924.9 filed on Aug. 30, 2019 with the China National Intellectual Property Administration, the disclosure of which is in entirety incorporated herein by reference.

TECHNICAL FIELD

The present disclosure relates to the technical field of microwave photonics, in particular to a frequency spectrum detection system.

BACKGROUND

In radar and other electronic warfare systems, the ability to measure the intercepted unknown microwave signals with high accuracy is crucial. Modern electronics technology can achieve high-precision frequency detection. Usually, the frequency of the signal to be measured may be distributed in a relatively wide frequency band. However, the electronic method has a limitation in the frequency bandwidth to be measured and may suffer from the electromagnetic interference during the measuring.

The above disadvantages of the electronics technology can be avoided by using the photonics method. In principle, the photonics-based method for the frequency detection of microwave signals can be roughly divided into the following three categories: the frequency detection method based on the photonics channelization technology; the frequency detection method based on the frequency-to-power mapping; and the frequency detection method based on the frequency-to-time mapping. Through the frequency detection method based on the photonics channelization technology, it can be realized to measure the frequency in a large bandwidth. However, this method has a quite large frequency measurement error, usually greater than 1 GHz, which cannot satisfy the requirements of most electronic warfare systems. The frequency detection method based on the frequency-to-power mapping, can achieve relatively high-precision frequency detection, but it can only detect single-frequency microwave signals and cannot detect multiple point-frequency signals simultaneously, due to which its application is limited. The frequency detection method based on the frequency-to-time mapping can detect multiple point-frequency signals. However, the frequency resolution of this method is limited by the accuracy of the optical time gate in the system, which is in the order of several hundred MHz.

SUMMARY

In view of the foregoing shortcomings of the related art, the main object of the present disclosure is to provide a frequency spectrum detection system, so as to at least partially solve at least one of the above technical problems.

In order to achieve the above goals, the present disclosure provides a frequency spectrum detection system, comprising: a frequency-scan light source, a phase modulator, an optical filter, an optical fiber, a photodetector, a power divider, an electric amplifier, a combiner, an electric filter, and an oscilloscope, wherein, a ring-shaped optoelectronic oscillator resonant cavity is defined by the frequency-scan light source, the phase modulator, the optical filter, the optical filter, the photodetector, and the electric amplifier together, the optoelectronic oscillator resonant cavity being configured to generate a frequency-scan signal with adjustable bandwidth and adjustable center frequency when a Fourier domain mode-locking condition is satisfied;

the combiner is configured to receive a signal to be measured, and to combine the signal to be measured with a frequency-scan signal generated by self-excited oscillation in the optoelectronic oscillator resonant cavity to form a combined electrical signal, the combined electrical signal being input into an electrical signal input terminal of the phase modulator;

the phase modulator is configured to modulate the combined electrical signal, which is input through the electrical signal input terminal, onto a frequency-scan optical signal emitted from the frequency-scan light source, and is configured to output a double-sideband phase-modulated optical signal;

the optical filter is configured to selectively attenuate or amplify one sideband of double sidebands of the double-sideband phase-modulated optical signal;

the photodetector is configured to detect a signal filtered by the optical filter;

the photodetector, the power divider, the electric amplifier, the combiner, and the phase modulator are connected through cables; and the power divider, the electric filter, and the oscilloscope are connected through cables.

In some embodiments, the frequency-scan light source is a current-driven frequency-scan semiconductor laser or a single-sideband-modulation-based frequency-scan light source, and the frequency-scan light source has an emission wavelength which is changed periodically.

In some embodiments, the optical filter is a notch optical filter, or an optical filter based on a stimulated Brillouin scattering effect gain spectrum.

In some embodiments, the frequency-scan light source, the phase modulator, the optical filter, and the photodetector together form a microwave photonics filter; and the microwave photonics filter has a frequency-scan period that matches a time delay due to a single pass of signals in a loop of the optoelectronic oscillator resonant cavity, which satisfies the following Fourier domain mode-locking condition:

$$nT=T_r;$$

wherein, n is a positive integer, T is a period of change of the microwave photonics filter, and $T_r$ is the time delay due to a single pass of the signals in the loop of the optoelectronic oscillator resonant cavity.

In some embodiments, the frequency spectrum detection system is configured to implement frequency spectrum detection in different frequency measurement ranges by changing a magnitude relationship between a frequency of the frequency-scan signal, a frequency of the signal to be measured and a center frequency of the electric filter.

In some embodiments, the frequency spectrum detection system further comprises a polarization controller for controlling a polarization state of optical signals.

In some embodiments, the frequency spectrum detection system further comprises an optical amplifier or a second electric amplifier for amplifying signals.

In some embodiments, the loop of the optoelectronic oscillator resonant cavity comprises a single loop or multiple loops.

DETAILED DESCRIPTION OF EMBODIMENTS

Figure 1:
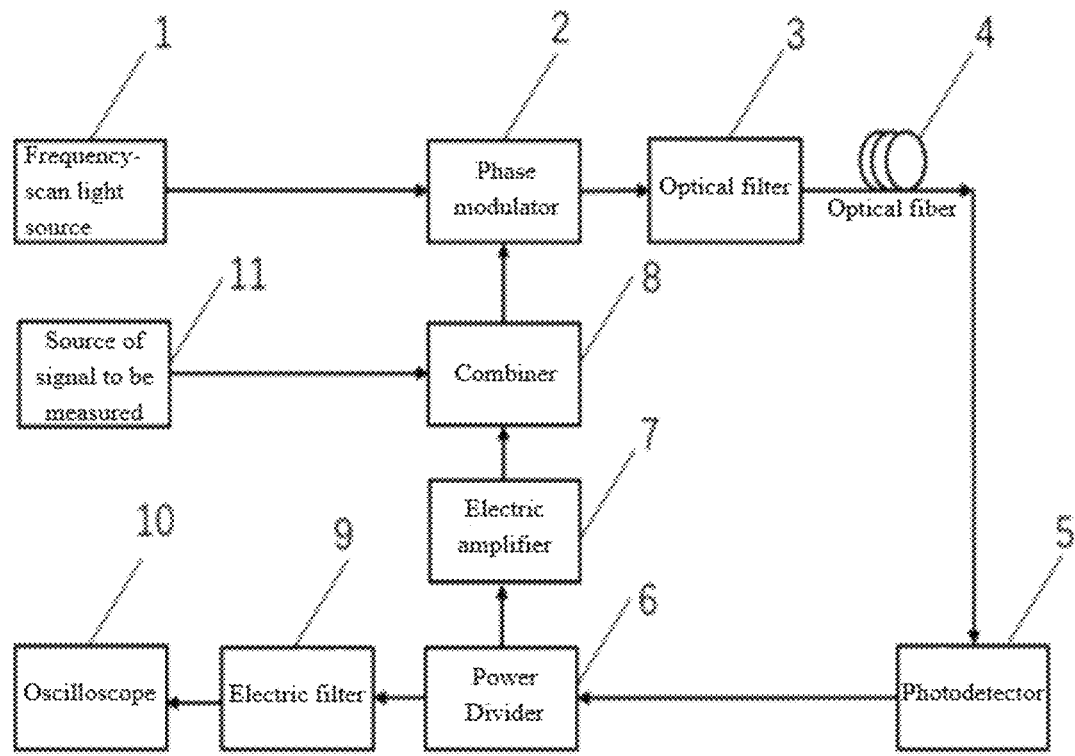
FIG. 1 schematically shows the structure of a frequency spectrum detection system according to an embodiment of the present disclosure.

In the drawings, reference numerals are listed as follows:
1 frequency-scan light source;
2 phase modulator;
3 optical filter;
4 optical fiber;
5 photodetector;
6 power divider;
7 electric amplifier;
8 combiner;
9 electric filter;
10 oscilloscope; and
11 source of signal to be measured.

In order to make the objectives, technical solutions, and advantages of the present disclosure clearer, the following further describes the present disclosure in detail with reference to specific embodiments and with reference to the accompanying drawings.

The present disclosure is based on microwave photonics technology. The signal to be measured is coupled into a Fourier domain mode-locked optoelectronic oscillator. With the aid of a filtering by a proper electric filter and based on the corresponding relationship between output frequency of the Fourier domain mode-locked optoelectronic oscillator and time (namely the frequency-scan characteristics of the Fourier domain mode-locked optoelectronic oscillator), the frequency-to-time mapping of the injected microwave signal may be realized, thereby achieving high-precision detection for unknown microwave signals. Furthermore, the present disclosure also uses the frequency-scan microwave generation performance of the Fourier domain mode-locked optoelectronic oscillator, the modulation characteristics of a phase modulator, and the square-law characteristics of a photodetector to achieve large-bandwidth and high-precision frequency spectrum detection for unknown microwave signals.

Specifically, the frequency spectrum detection system of the present disclosure includes: a frequency-scan light source, a phase modulator, an optical filter, an optical fiber, a photodetector, a power divider, an electric amplifier, a combiner, an electric filter, an oscilloscope and a source of signal to be measured. The frequency-scan light source, the phase modulator, the optical filter, the optical fiber and the photodetector are connected through optical fiber jumpers. The photodetector, the power divider, the electric amplifier, the combiner, and the phase modulator are connected through cables. The power divider, the electric filter and the oscilloscope are connected through cables. The frequency-scan light source, the phase modulator, the optical filter and the photodetector form a high-precision frequency-scan microwave photonics filter.

A ring-shaped optoelectronic oscillator resonant cavity is formed by the frequency-scan light source, the phase modulator, the optical filter, the optical filter, the photodetector, and the electric amplifier. The ring-shaped optoelectronic oscillator resonant cavity may generate a frequency-scan signal which is adjustable within a broadband, when the Fourier domain mode-locking condition is satisfied.

Wherein the Fourier domain mode-locking conditions are:

$$nT=T_r$$

wherein, n is a positive integer, T is a period of change of the microwave photonics filter, and $T_r$ is a time delay due to a single pass of signals in a loop of the optoelectronic oscillator resonant cavity.

The frequency-scan light source is a current-driven frequency-scan semiconductor laser or a single-sideband-modulation-based frequency-scan light source, and has an emission wavelength which is changed periodically.

The optical filter is a notch optical filter with an ultra-narrow bandwidth or an ultra-narrow bandwidth optical filter based on a stimulated Brillouin scattering effect gain spectrum, for example, the bandwidth is tens of MHz.

The frequency spectrum detection system can achieve frequency spectrum detection in different frequency measurement ranges by changing a magnitude relationship between the frequency of the frequency-scan signal, the frequency of the signal to be measured and a center frequency of the electric filter.

The frequency spectrum detection system further includes a polarization controller for controlling the polarization state of optical signals.

The frequency spectrum detection system further includes an optical amplifier or other electric amplifier for amplifying optical signals.

The loop of the optoelectronic oscillator resonant cavity is the single loop. Alternatively, the optoelectronic oscillator resonant cavity may have multiple loops with a number larger than or equal to two.

During operation, the signal to be measured is input from the source of signal to be measured to the combiner, in which the signal to be measured is combined with the frequency-scan signal generated by self-excited oscillation in the optoelectronic oscillator resonant cavity so as to form a combined electrical signal. Then the combined electrical signal is input into the electrical signal input terminal of the phase modulator. The phase modulator is configured to modulate the combined electrical signal onto a frequency-scan optical signal emitted from the frequency-scan light source. The double-sideband phase-modulated optical signal output by the phase modulator, after one of its double-sideband is selectively attenuated or amplified by the optical filter, is input into the photodetector through the optical fiber. Due to the square-law characteristic of the photodetector, the signal to be measured which has been modulated onto an optical carrier will be combined with the frequency-scan signal in the resonant cavity, generating a beat frequency signal. The photodetector outputs the beat frequency signal to the power divider. The power divider divides the beat frequency signal into two paths. Through one path, the signal is returned to the electric amplifier so as to be coupled with the signal to be measured. Through the other path, the signal is input to the electric filter with a known pass-band.

In this way, the signal to be measured is detected, and the detection of the signal to be measured is completed.

The operating principle of the entire frequency spectrum detection system will be described hereinafter. A high-precision frequency-scan microwave photonics filter is formed by the frequency-scan light source, the phase modulator, the optical filter, and the photodetector. The microwave photonics filter has a frequency-scan period that matches the time delay due to the single pass of signals in the loop of the optoelectronic oscillator resonant cavity, which satisfies the Fourier domain mode-locking condition. Driven by a known periodic signal, there is a certain corresponding relationship between the frequency of the frequency-scan microwave signal output by the Fourier domain mode-locked optoelectronic oscillator and time. The microwave signal to be measured is coupled to the Fourier domain mode-locked optoelectronic oscillator in operation. Due to the square-law characteristic of the photodetector, the signal to be measured which has been modulated on the optical carrier will be combined with the frequency-scan signal in the resonant cavity to generate a beat frequency signal. The electric filter with a known pass-band is added to the output terminal of the Fourier domain mode-locked optoelectronic oscillator. The information of the signal to be measured can be obtained by observing the information of the beat frequency signal passing through the electric filter so as to achieve the detection of the signal to be measured.

The technical solution of the present disclosure will be described in detail through specific embodiments with reference to the accompanying drawings.

As shown in FIG. 1, it schematically shows the structure of the frequency spectrum detection system according to an embodiment of the present disclosure, which mainly includes: a frequency-scan light source 1, a phase modulator 2, an optical filter 3, a segment of optical fiber 4, a photodetector 5, a power divider 6, an electric amplifier 7, a combiner 8, an electric filter 9, an oscilloscope 10, and a source of signal to be measured 11. The frequency-scan light source 1, the phase modulator 2, the optical filter 3, the optical fiber 4, and the photodetector 5 are connected in sequence through optical fiber jumpers. The photodetector 5, the power divider 6, the electric amplifier 7, the combiner 8, and the phase modulator 2 are connected in sequence through cables; and the power divider 6, the electric filter 9, and the oscilloscope 10 are connected in sequence through cables.

Figure 2:
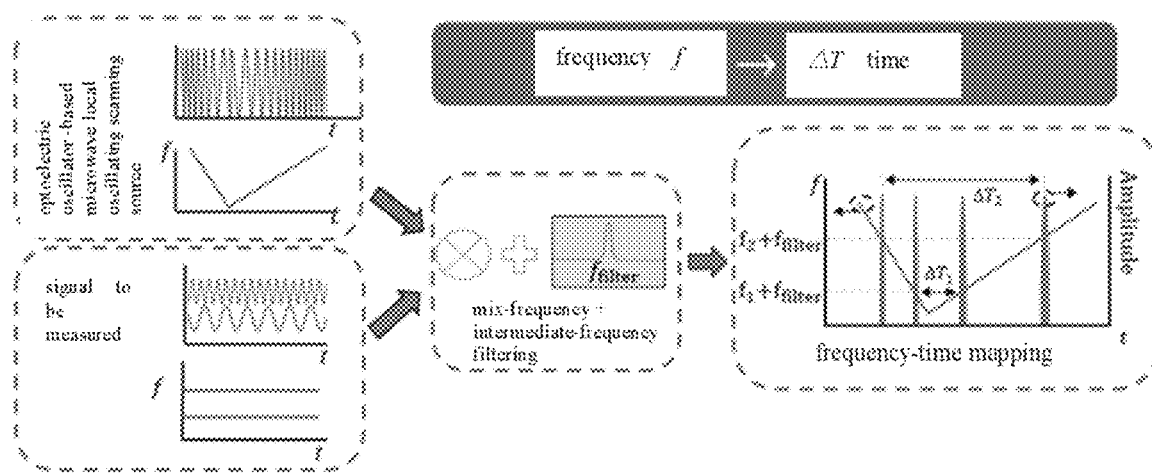
FIG. 2 is a principle diagram of a frequency spectrum detection system according to an embodiment of the present disclosure.

The frequency-scan light source 1, the phase modulator 2, the optical filter 3, the optical fiber 4, the photodetector 5, the electric amplifier 7, the power divider 6, and the combiner 8 form a Fourier domain mode-locked optoelectronic oscillator. In the Fourier-domain mode-locking optoelectronic oscillator, the frequency-scan light source 1, the phase modulator 2, the optical filter 3, and the photodetector 5 form a high-precision frequency-scan microwave photonics filter. The microwave photonics filter has a frequency-scan period that matches the time delay due to the single pass of signals in a loop of the optoelectronic oscillator resonant cavity, which satisfies the following Fourier domain mode-locking condition:

$$nT=T_r;$$

wherein, n is a positive integer, T is a period of change of the microwave photonics filter, and $T_r$ is the time delay due to the single pass of the signals in the loop of the optoelectronic oscillator resonant cavity. At this time, the optoelectronic oscillator works in the Fourier domain mode-locked state and can output periodic frequency-scan microwave signals. As shown in FIG. 2, when the microwave photonics filter is driven by a sawtooth wave, the Fourier domain mode-locked optoelectronic oscillator outputs a periodic linear frequency-modulated signal. There is a periodic correspondence between the frequency of the signal and time.

Figure 3:
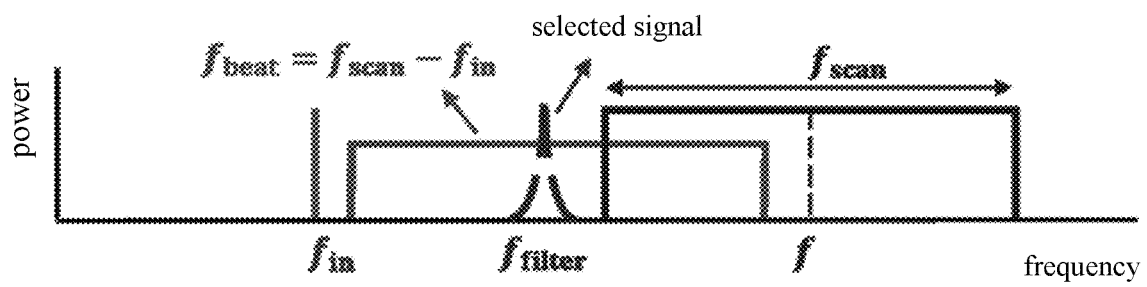
FIG. 3 schematically shows the frequency spectrum in an embodiment of the present disclosure.

The principle diagram of the frequency spectrum detection system is shown in FIG. 2. The microwave signal to be measured is coupled to the Fourier domain mode-locked optoelectronic oscillator through the combiner 8. Due to the square-law characteristic of the photodetector, the signal to be measured which has been modulated onto the optical carrier will be mixed with the frequency-scan signal in the resonant cavity. The electric filter with a known pass-band is added to the output terminal of the Fourier domain mode-locked optoelectronic oscillator. The electric filter can output signals only when the frequency of the beat frequency signal matches the center frequency of the electric filter. Due to the bidirectional frequency-scan characteristics of the Fourier domain mode-locked optoelectronic oscillator, when a single-frequency microwave signal is injected, the electric filter outputs two pulses in one frequency-scan period and the time interval between the pulses is related to the frequency of the signal to be measured. Therefore, the frequency information of the signal to be measured can be obtained by observing the time interval of the time domain pulse output by the electric filter, thereby realizing the detection of the signal to be measured. Assume that the frequency of the signal to be measured is lower than the frequency of the frequency-scan signal, and the center frequency of the electric filter is higher than the frequency of the signal to be measured. As shown in FIG. 3, if the actual frequency of the signal to be measured is $f_{in}$, the frequency of the frequency-scan signal generated by the Fourier domain mode-locked optoelectronic oscillator is $f_{scan}$, and the center frequency of the pass-band of the electric filter is $f_{filter}$, the beat frequency signal obtained after the frequency mixing of the signal to be measured and the frequency-scan signal is $f_{beat}=f_{scan}-f_{in}$. When the beat frequency signal satisfies $f_{beat}=f_{filter}$, it can be observed on the oscilloscope that the electric filter has an output signal. When the frequency of the frequency-scan signal is not equal to $f_o=f_{filter}+f_{in}$, the mixing term cannot pass the electric filter. Therefore, due to the bidirectional frequency-scan characteristic of the Fourier domain mode-locked optoelectronic oscillator, the electric filter can obtain two pulse outputs in one frequency-scan period. In the case where the frequency-scan characteristics of the Fourier domain mode-locked optoelectronic oscillator and the characteristics of the electric filter are known, the frequency information of the signal to be measured can be obtained from the time difference between the output pulses output by the electric filter and observed on the oscilloscope.

Figure 4:
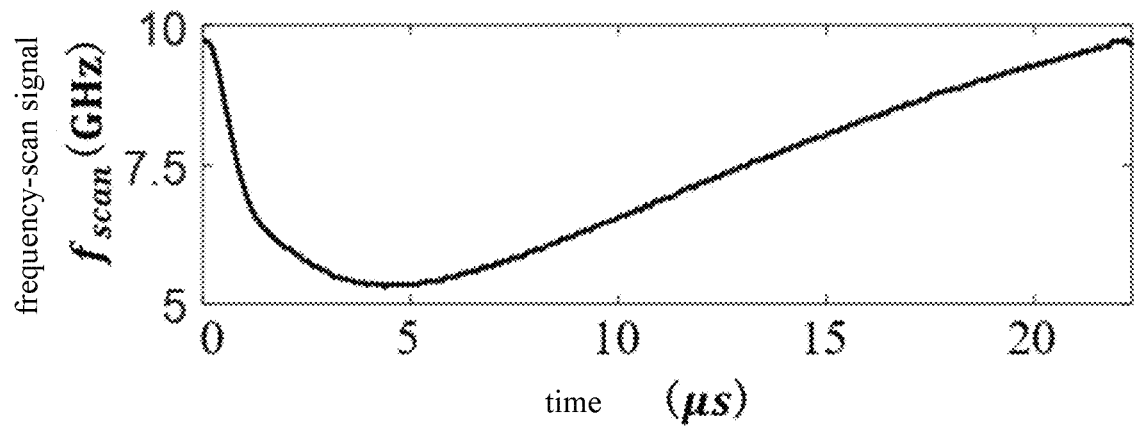
FIG. 4 is a measured frequency-scan characteristics of a Fourier domain mode-locked optoelectronic oscillator.
Figure 5:
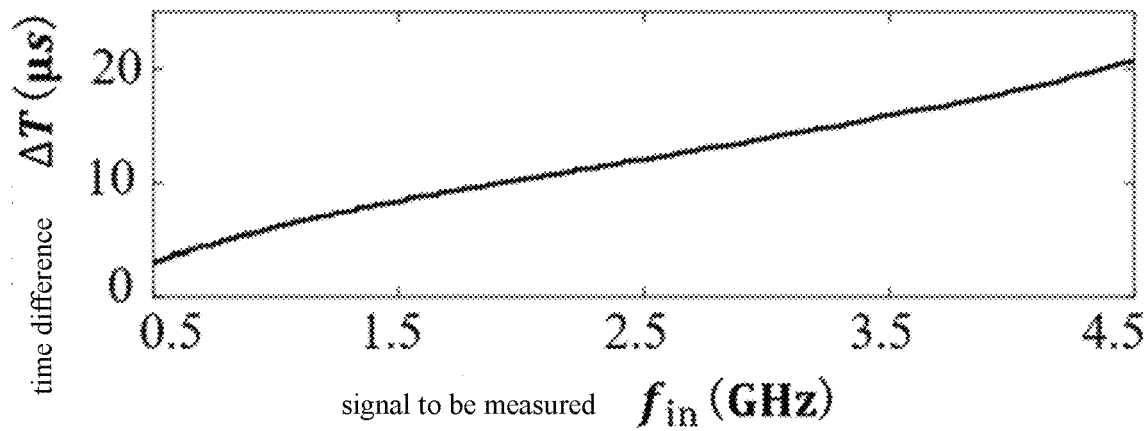
FIG. 5 is a time-frequency mapping relationship of a frequency spectrum detection system according to an embodiment of the present disclosure.
Figure 6:
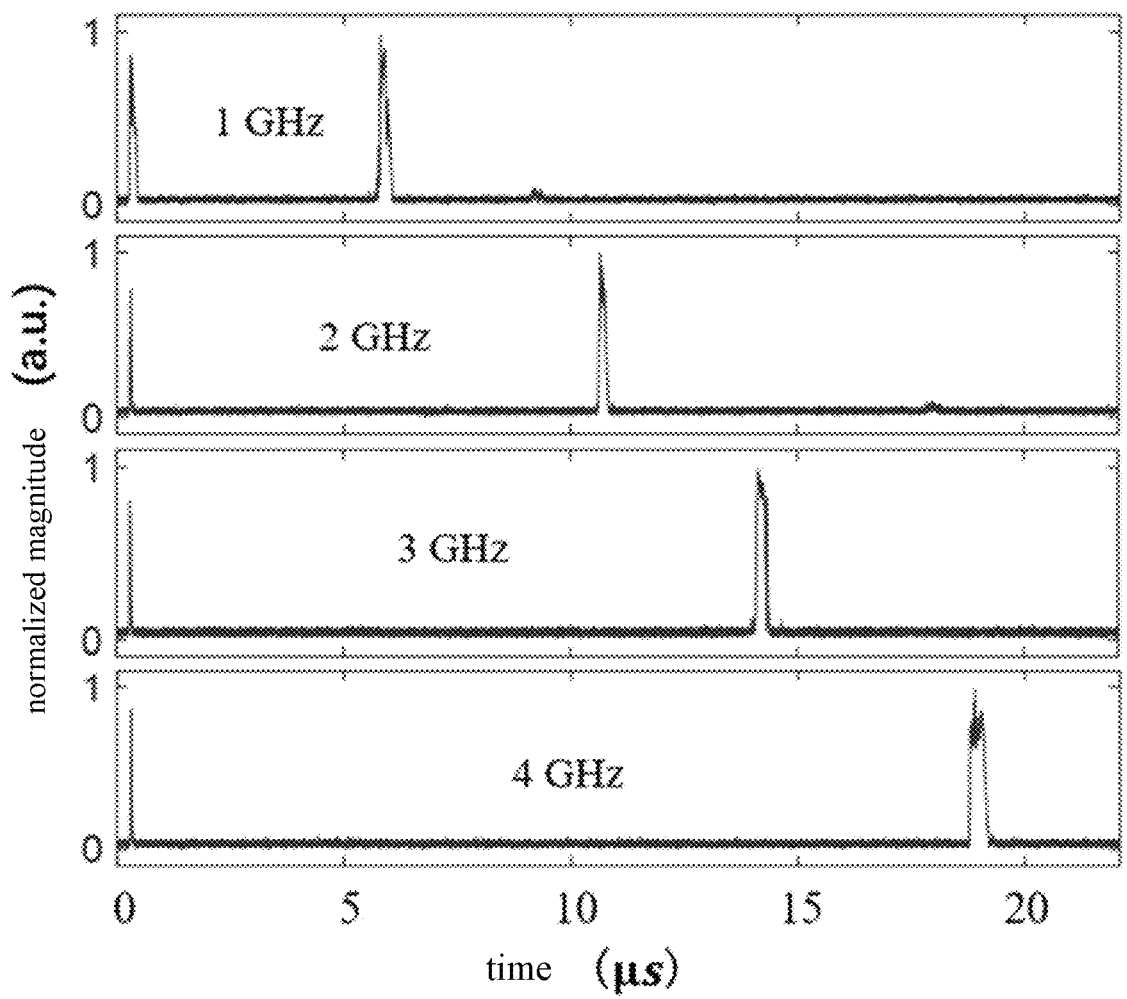
FIG. 6 is an output pulse envelope measured by a frequency spectrum detection system according to an embodiment of the present disclosure.

FIG. 4 shows a measured frequency-scan characteristics of the Fourier domain mode-locked optoelectronic oscillator in a test. It can be seen that the frequency of the frequency-scan signal decreases first and then increases during one frequency-scan period. That is, the Fourier domain mode-locked optoelectronic oscillator has a bidirectional frequency-scan characteristic. When the electric filter detects the difference frequency term, the relationship between the frequency of the input signal to be measured and the time interval of the output pulse of the electric filter is shown in FIG. 5. It can be seen that the frequency of the input signal to be measured and the time interval of the output pulses are positively correlated. Therefore, the Fourier domain mode-locked optoelectronic oscillator can realize the mapping from the frequency of the microwave signal to be measured to time. When single-frequency microwave signals of different frequencies are injected into the Fourier domain mode-locked optoelectronic oscillator, the pulse envelope obtained on the oscilloscope is shown in FIG. 6. It can be seen that the higher the frequency of the input signal, the longer the time interval between the output pulses. By means of the time domain information shown in FIG. 6 and the mapping relationship between the signal frequency and time shown in FIG. 5, the detection of the frequency of the input signal may be realized.

Further, frequency spectrum detection in different frequency measurement ranges can be achieved by changing a magnitude relationship between the frequency of the frequency-scan signal, the frequency of the signal to be measured and the center frequency of the electric filter. For example, similar to the method of observing the difference frequency shown in FIG. 3, when the frequency of the signal to be measured satisfies $f_{filter}=f_{in}+f_{scan}$, the frequency spectrum detection may also be realized through selecting, by the electric filter, the sum frequency of the signal to be measured and the frequency-scan signal in the Fourier domain mode-locked optoelectronic oscillator.

In addition, the above definitions of the elements and methods are not limited to the specific structures, shapes, or methods mentioned in the embodiments, and those skilled in the art can simply modify the structures, such as adding a polarization controller for controlling the polarization state of the optical signal to achieve better spectral detection performance; adding an optical amplifier in the optical path or other electric amplifier to amplify the signal. The attached drawings are simplified and used for illustration. The number, shape, and size of the devices shown in the drawings may be modified according to actual conditions, and the configuration of the devices may be more complicated.

Based on the above technical solutions, it can be known that the frequency spectrum detection system and method of the present disclosure have the following advantages:

(1) the mapping from the frequency of the signal to be measured to time is realized by means of the Fourier domain mode-locked optoelectronic oscillator, so the frequency information of the signal to be measured can be obtained from the time domain information of the output signal;

(2) the detectable frequency range of the signal is related to the frequency-scan bandwidth of the Fourier domain mode-locked optoelectronic oscillator. Since the frequency-scan signal generated by the Fourier domain mode-locked optoelectronic oscillator may be adjustable within a broadband, the present disclosure can realize broadband frequency spectrum detection;

(3) for a high-frequency signal to be measured, due to the square-law characteristics of the photodetector, the frequency characteristics of the high-frequency signal to be measured can be obtained by observing the difference frequency between the high-frequency signal to be measured and the frequency-scan signal in the Fourier domain mode-locked optoelectronic oscillator, thereby realizing the detection of high-frequency microwave signals;

(4) the accuracy of the frequency spectrum detection method of the present disclosure is mainly determined by the bandwidth of the electric filter; though using of a high-performance narrowband electric filter, the frequency spectrum detection may be implemented with an accuracy of the order of tens of MHz or even less than it.

The specific embodiments described above further describe the objectives, technical solutions, and beneficial effects of the present disclosure. It should be understood that the above are only specific embodiments of the present disclosure and are not intended to limit the present disclosure. Any modification, equivalent replacement, or improvement made within the spirit and principle of the present disclosure shall be included in the protection scope of the present disclosure.

What is claimed is:

1. A frequency spectrum detection system, comprising: a frequency-scan light source, a phase modulator, an optical filter, an optical fiber, a photodetector, a power divider, an electric amplifier, a combiner, an electric filter, and an oscilloscope, wherein,
   a ring-shaped optoelectronic oscillator resonant cavity is defined by the frequency-scan light source, the phase modulator, the optical filter, the optical fiber, the photodetector, and the electric amplifier together, the optoelectronic oscillator resonant cavity being configured to generate a frequency-scan signal with adjustable bandwidth and adjustable center frequency when a Fourier domain mode-locking condition is satisfied;
   the combiner is configured to receive a signal to be measured, and to combine the signal to be measured with a frequency-scan signal generated by self-excited oscillation in the optoelectronic oscillator resonant cavity to form a combined electrical signal, the combined electrical signal being input into an electrical signal input terminal of the phase modulator;
   the phase modulator is configured to modulate the combined electrical signal, which is input through the electrical signal input terminal, onto a frequency-scan optical signal emitted from the frequency-scan light source, and is configured to output a double-sideband phase-modulated optical signal;
   the optical filter is configured to selectively attenuate or amplify one sideband of double sidebands of the double-sideband phase-modulated optical signal;
   the photodetector is configured to detect a signal filtered by the optical filter;
   the photodetector, the power divider, the electric amplifier, the combiner, and the phase modulator are connected through cables; and
   the power divider, the electric filter, and the oscilloscope are connected through cables.

2. The frequency spectrum detection system according to claim 1, wherein the frequency-scan light source is a current-driven frequency-scan semiconductor laser or a single-sideband-modulation-based frequency-scan light source, and the frequency-scan light source has an emission wavelength which is changed periodically.

3. The frequency spectrum detection system according to claim 1, wherein the optical filter is a notch optical filter, or an optical filter based on a stimulated Brillouin scattering effect gain spectrum.

4. The frequency spectrum detection system according to claim 1, wherein,
   the frequency-scan light source, the phase modulator, the optical filter, and the photodetector together form a microwave photonics filter, and
   the microwave photonics filter has a frequency-scan period that matches a time delay due to a single pass of signals in a loop of the optoelectronic oscillator resonant cavity, which satisfies the following Fourier domain mode-locking condition:

$nT=T_r;$ wherein, n is a positive integer, T is a period of change of the microwave photonics and $T_r$ is the time delay due to a single pass of the signals in the loop of the optoelectronic oscillator resonant cavity.

5. The frequency spectrum detection system according to claim 1, wherein the frequency spectrum detection system is configured to implement frequency spectrum detection in different frequency measurement ranges by changing a magnitude relationship between a frequency of the frequency-scan signal, a frequency of the signal to be measured and a center frequency of the electric filter.

6. The frequency spectrum detection system according to claim 1, wherein the frequency spectrum detection system further comprises a polarization controller for controlling a polarization state of optical signals.

7. The frequency spectrum detection system according to claim 1, wherein the frequency spectrum detection system further comprises an optical amplifier or a second electric amplifier for amplifying signals.

8. The frequency spectrum detection system according to claim 1, wherein the loop of the optoelectronic oscillator resonant cavity comprises a single loop or multiple loops.

* * * * *